United States Patent [19]

Ward

[11] Patent Number: 4,634,874
[45] Date of Patent: Jan. 6, 1987

[54] ELECTRON LITHOGRAPHY APPARATUS

[75] Inventor: Rodney Ward, Ifield, England

[73] Assignee: U.S. Philips Corporation, New York, N.Y.

[21] Appl. No.: 654,436

[22] Filed: Sep. 26, 1984

[30] Foreign Application Priority Data

Sep. 26, 1983 [GB] United Kingdom ............... 8325670

[51] Int. Cl.$^4$ ............................................. H01J 37/30
[52] U.S. Cl. .................................... 250/492.2; 250/398
[58] Field of Search ............... 250/492.1, 492.2, 492.3, 250/396 R, 398, 399; 313/452, 373, 382

[56] References Cited

U.S. PATENT DOCUMENTS 4,360,760 11/1982 Brodowski ...................... 250/396 R
4,438,557 3/1984 Parker et al. ..................... 250/492.3

FOREIGN PATENT DOCUMENTS 2700357 7/1978 Fed. Rep. of Germany ... 250/492.2
2719799 11/1978 Fed. Rep. of Germany ... 250/492.1
0132269 11/1978 Japan ................................. 250/492.2

OTHER PUBLICATIONS

J. P. Scott, 1:1 Electron Image Projector, Solid State Tech. vol. 20, No. 5 (May 1977), pp. 43–47.
Heynick et al., Projection Electron Lithography Using Aperture Lenses, IEEE Transactions on Electron Devices, vol. ED-22, No. 7, (Jul. 1975).

Primary Examiner—Craig E. Church
Assistant Examiner—Paul A. Guss
Attorney, Agent, or Firm—Paul R. Miller

[57] ABSTRACT

An electron image projector for transferring mask patterns onto a semiconductor wafer comprises a patterned photoemissive cathode mask and a target formed by the semiconductor wafer coated with an electron sensitive resist. A patterned electron beam is projected from the cathode onto the target with unity magnification by acceleration with a uniform electric field E and focussing by a uniform magnetic field H. The electric field E is established between the cathode and an electron permeable anode grid situated between the cathode and the target. For fast alignment with low power consumption, beam deflection is achieved electrostatically. The electrostatic deflection plates which may be integral with the anode grid or form part of a further grid, are arranged for deflecting at least part of the beam as it travels from the anode grid to the target. In one arrangement to correct for misalignment, the entire beam is deflected in the same direction. In another arrangement part of the beam is oscillated in one direction, while another part of the beam is simultaneously oscillated at a different frequency in a different direction, and phase sensitive detection is used to align the mask and the target.

20 Claims, 13 Drawing Figures

ELECTRON LITHOGRAPHY APPARATUS

This invention relates to an electron image projector for projecting with substantially unity magnification a beam of electrons emitted by a cathode onto a target under the action of substantially uniform electric and magnetic fields, wherein the beam of electrons has a predetermined spatial pattern which extends transversely to the electric field.

An electron image projector can be used in the manufacture of high resolution microminiature solid state devices, such as semiconductor devices, for defining lithographically a pattern in an electron sensitive resist layer provided on a substrate. The patterned electron beam emitted by the cathode is projected onto the resist layer to define therein a pattern reproducing the pattern of the electron beam. After exposure the resist is developed and the patterned resist layer thus formed is used as a stencil during subsequent processing of the substrate to form the device in question.

An electron image projector having the features mentioned in the opening paragraph is known, for example, from the paper by J. P. Scott entitled "1:1 Electron Image Projector" which appeared in Solid State Technology, May 1977, pages 43 to 47. The main advantages of this electron image projector can be summarised as fast exposure times and high resolution capability.

This known unity magnification electron image projector does, however, have the disadvantage that the target, i.e. the resist coated substrate, constitutes an anode and in operation a large potential difference (typically 20 kV) is applied between the cathode and the anode to establish the electric field under the action of which the electron beam is projected from the cathode onto the target. This imposes stringent planarity requirements on the substrate in order not to distort unduly the electric field—and hence the electron trajectories—in the vicinity of the target. Inevitably the electric field will suffer some distortion at the periphery of the substrate. This can be a problem, especially if the substrate is held on the type of electrostatic chuck shown in FIG. 4 of the aforementioned paper by J. P. Scott, in which an overlapping lip is present at the surface of the wafer facing the cathode. In this case it is necessary to locate the substrate with great precision for each subsequent exposure in the image projector in order to obtain optimum registration.

A modified unity magnification electron image projector which circumvents these problems is disclosed in our co-pending (as yet unpublished) British Patent Application No. 8323769, corresponding to U.S. patent application Ser. No. 645,881, filed Aug. 30, 1984. This modified image projector comprises a novel anode comprising a grid having an array of electron permeable regions, which array is at least as extensive as the spatial pattern of electrons emitted by the cathode. The grid is disposed between and parallel to the cathode and the target. In operation a substantially uniform electric field is produced between the cathode and the grid. Means are provided for producing a substantially uniform magnetic field parallel to the electric field to focus the patterned beam of electrons onto the target. Means are also provided for deflecting the patterned beam of electrons transversely to the electric and magnetic fields. This modified electron image projector has the advantage that the dependence of the electron trajectories on the shape and/or disposition of the target can be reduced.

By way of explanation it is noted here that the electrons emitted by the cathode are directed towards the target generally in mutually parallel straight lines parallel to the electric and magnetic fields. To be more exact electrons which are emitted at an angle other than normal to the cathode describe a helix about an axis parallel to the magnetic focusing field. The number of revolutions described is independent of angle. The distance between the cathode and the anode grid and between the anode grid and the target can therefore be selected (depending on the value of the electric and magnetic fields) so that the number of revolutions is an integer, for example unity. Electrons emitted from any particular point on the cathode over a range of angles about the normal are thus focussed by the magnetic field to impinge at a single corresponding point on the anode grid and on the target. In this situation the anode grid and the target are said to be at the focii of the magnetic field. When the number of revolutions described between the cathode and anode grid is unity the anode grid is said to be at the first magnetic focus. When the number of revolutions between the cathode and the target is two the target is at the second magnetic focus. Thus an electron emissive pattern on the cathode can be reproduced in focus at the anode grid and at the target with unit magnification. Although an individual electron may follow a helical path as described here, it is emphasized that the general direction of motion is a straight line parallel to the electric and magnetic fields.

As acknowledged in our aforementioned British Patent Application No. 8323769 an advantage of the modified electron image projector described therein is that it enables fast and efficient alignment of the target with respect to the cathode by detecting electrons back-scattered from the target using a detector disposed between the grid and the target. Alignment involves deflection of the patterned electron beam. In known electron image projectors this is achieved magnetically using air cored deflection coils for applying a magnetic deflection field transverse to the magnetic focussing field. The strength of the magnetic deflection field and hence the magnitude of the deflection can be varied by altering the electric current flowing in the deflection coils. Unfortunately, however, to provide uniform magnetic fields deflection coils must necessarily be relatively cumbersome components which add significantly to the overall size of the electron image projector. The resulting magnetic field extends over a large volume. This is detrimental because that volume cannot be occupied by other apparatus, such as another electron image projector, an electron beam pattern generator or an electron microscope which would be adversely affected by unpredictable magnetic field changes. Thus a restriction is imposed on how closely other such apparatus can be located to the electron image projector in question. This is, of course, a three dimensional, and not merely a two dimensional problem. Thus when an electron image projector is installed in a multi-story building it can affect apparatus not only on the same floor but also on other floors, whether above or below, the installation. Also, because of (1) the inherent self-inductance of the deflection coils and (2) the undesired generation of eddy currents in response to the changing magnetic field, the speed of deflection tends to be impeded. Unfortunately, therefore, a substantial amount of power may have to be consumed in changing the magnetic field sufficiently rapidly over such a large volume.

According to the present invention there is provided an electron image projector for projecting with substantially unity magnification a beam of electrons emitted by a cathode onto a target under the action of a substantially uniform electric field wherein the beam of electrons has a predetermined spatial pattern which extends transversely to the electric field with the projector comprising an electron emissive cathode with an anode comprising a grid having an array of electron permeable regions with the array being at least as extensive as the spatial pattern, which grid is disposed intermediate and parallel to the cathode and the target whereby in operation the electric field is produced between the cathode and the anode grid with the projector further comprising means for producing a substantially uniform magnetic field parallel to the electric field to focus the patterned beam of electrons onto the target, and means for deflecting electrons of the beam transversely to said electric and magnetic fields with the deflection means comprising electrostatic deflection plates arranged for deflecting at least part of the electron beam during its passage from the surface of the grid facing the cathode to the target.

Thus in an image projector in accordance with the invention not only are the projecting and deflecting fields both electric but also they are spatially distinct in that during operation the projecting electric field is established between the cathode and the surface of the grid facing the cathode, and the deflecting electric field is established transversely thereto in a region intermediate the target and the surface of the grid facing the cathode. The deflecting electric field is established between electrostatic deflection plates which, compared with deflection coils, have the advantage of relative compactness and therefore do not add to the overall size of the image projector. Moreover, the electric field can be contained within the confines of the electron image projector apparatus so that another such image projector (or other apparatus sensitive to a changing magnetic field) can be located in close proximity without being adversely affected by the operation of its neighbour. Also, electrostatic deflection has the advantage of high speed with only relatively low power consumption.

Preferably the surface of the anode grid facing the cathode is disposed substantially in coincidence with a focus of the magnetic field. Thus when the target is also substantially at a magnetic focus any distortion which otherwise may have been introduced by the electric lens effect of the grid is optimally compensated by the magnetic field.

In order to obtain maximum deflection capability the electrostatic deflection plates can be arranged for deflecting electrons of the beam in two mutually orthogonal directions. Thus the electron image projector may comprise two pairs of deflection plates for providing deflections in the X- and Y- directions respectively.

However several sets of electrode pairs may be employed for the deflections in each of the two mutually orthogonal directions. In this case the electron permeable grid comprises portions each having associated therewith a respective set of electrostatic deflection plates. This has the advantage that for the same field strength the voltage difference applied between the deflection plates can be significantly reduced because the deflection plates are more closely spaced.

In an embodiment where the anode grid comprises an array of relatively electron-permeable and relatively electron-impermeable regions, the voltage applied across the deflection plates can be minimized for a given field strength when each of the electron permeable regions has associated therewith a respective set of electrostatic deflection plates.

The projector may comprise means for moving the grid transversely to the direction of motion of the electrons so that the pattern produced on the target by exposure thereof reproduces the pattern of the electron beam without reproducing the array of the grid. In this case it is preferable that the electrostatic deflection plates are rigidly fixed with respect to the electron permeable anode grid. To this end, when the electron permeable regions are in the form of apertures in the grid the deflection plates can be provided on the walls of these apertures, for example by directional evaporation as discussed in more detail below. Alternatively the deflection plates may themselves form part of a further grid which is rigidly connected to the electron permeable anode grid. When deflection in two directions is required the deflection plates for one direction may be provided on the anode grid and the deflection plates for the orthogonal direction may form part of the further grid. Alternatively the deflection plates for one direction may be provided at one major surface of the further grid and the deflection plates for the orthogonal direction may be provided at the opposite major surface of the further grid.

In another embodiment the electron permeable anode grid has at least one area with associated electrostatic deflection plates for deflecting part of the electron beam in a first direction and at least one other area with associated deflection plates arranged for simulataneously deflecting another part of the electron beam in a second different direction. With this arrangement it is possible to deflect in an osciallatory manner one part of the beam in one direction at one frequency and another part of the beam again in an oscillatory manner, but in a different direction and with a different frequency or phase. As discussed below this facility can be used in a phase sensitive detection method for aligning the target with the cathode using reference markers on the target and a corresponding patterned portion of the electron beam.

Embodiments of the invention will now be described by way of example with reference to the accompanying drawings, in which:

FIGS. 5b and 5c are plan views of single pairs of the deflection plates in FIG. 5a, FIG. 6a is a schematic sectional view of part of the anode grid and some of the deflection plates in a further embodiment, and FIGS. 6b and 6c are plan views of single pairs of the deflection plates in FIG. 6a.

It is noted here that, for the sake of clarity, the Figures are not drawn to scale.

The electron image projector shown in FIG. 1 comprises a photocathode mask 1 and a target 3 onto which a patterned electron beam can be projected from the photocathode mask 1 under the action of a uniform electric field as described in more detail below. The target 3 is parallel to the photocathode mask 1. A grid 2 is disposed intermediate and with its major surfaces parallel to the photocathode mask 1 and the target 3. The photocathode mask 1, the grid 2, and the target 3 are enclosed within a vacuum chamber 8 in which a low pressure of, for example, $10^{-5}$ Torr, is maintained during operation.

The photocathode mask comprises a circular quartz plate 4 which may be, for example 115 mm in diameter and 3 mm thick. A patterned layer 5 of material opaque to ultraviolet radiation, for example a 1000 angstrom thick chromium layer is present on the surface 7 of the plate 4 facing the grid 2. A continuous photoemissive layer 6, for example a layer of 200 angstroms thick, covers the patterned opaque layer and the exposed areas of the surface. In order to avoid charging effects a thin continuous conducting layer, for example a layer of chromium 200 angstroms thick, is provided on the patterned opaque layer 5 and an exposed parts of the plate 4. For the sake of clarity this conducting chromium layer, which is so thin as to be optically transparent, is not shown in FIG. 1.

The grid 2 constitutes an anode to which a potential can be applied for establishing an electric field between the grid 2 and the photocathode mask 1 as discussed in more detail below. The grid 2 is both electrically conductive and non-magnetic, and consists of a regular array of alternately relatively electron-permeable and relatively electron-impermeable regions formed, for example, by (1) a thin apertured copper sheet, (2) an apertured thin sheet of plastics coated with a conductive layer, (3) an apertured silicon wafer, (4) a glass channel plate, or (5) an apertured sheet of photo-etchable glass provided with a metallization at one major surface. These forms of grid are described in more detail in our copending British Patent Application No. 8323769 corresponding to U.S. patent application Ser. No. 645,881, filed Aug. 30, 1984, to which reference is invited. The grid is mounted on an electrically conductive ring 9 which is supported in the projector as described in the aforementioned British Patent Application and which can be moved in its own plane by moving means M.

The target 3 comprises an electron sensitive resist layer 10 present on a semiconductor wafer 11 held by a chuck 12, for example an electrostatic chuck as disclosed in our British Patent GB No. 1,443,215 or our European Patent Application EP No. 0,074,691.

An ultraviolet lamp 13 is situated outside the vacuum chamber 8 and is operable to illuminate the surface of the photocathode mask 1 remote from the grid 2. The ultraviolet radiation reaches the photocathode mask via a window 14 in the vacuum chamber.

In operation a large potential difference V of, for example, 20 kV is applied between the photocathode mask 1 and the grid 2 (via ring 9) to establish an electric field E therebetween. Under the action of this electric field E electrons emitted from portions of the photoemissive layer 6 which do not overlie the patterned opaque layer 5 and which therefore are exposed to radiation from the lamp 13 are projected to the anode grid as a beam of electrons having a spatial pattern which extends transversely to the electric field E. The pattern of the electron beam corresponds to the pattern of the photocathode mask 1 determined by those portions of the photoemissive layer 6 where the patterned opaque layer 5 is not present.

A substantially uniform magnetic field H for focussing the patterned electron beam is produced in known manner by air cored solenoids 15 which surround the vacuum chamber so that the magnetic field H is parallel to the electric field E and extends at least in the whole of the region between the photocathode mask 1 and the target 3. The strength of the magnetic field may, for example, be 2 KG. The electrons are thus directed generally in mutually parallel straight lines from the photocathode mask 1 towards the target 3.

The spacing between the photocathode mask 1 and the anode grid 2 is selected to be such that the surface of the grid 2 facing the photocathode mask 1 is located substantially in coincidence with the first magnetic focus in relation to the cathode as explained above. A focused electron image is thus formed substantially at the surface of the grid facing the cathode, i.e. in the entrance plane of the grid. It is noted here, however, that it may be preferable for the magnetic field and the entrance plane of the grid not to be exactly coincident, but slightly displaced so that the cathode is very slightly closer to the entrance plane than to the magnetic focus.

Electrons which are able to pass through the apertures or electron-permeable regions of the grid 2 enter the region between the grid 2 and the target 3. Preferably there is no potential difference between the target 3 and the grid 2 so that the resist coated semiconductor wafer is held at the same potential V as the grid 2. However, to correct for small inaccuracies, a small voltage $\delta V$ which is much less than the projecting voltage V, for example a few percent or less, and not more than about 5% thereof, may be applied between the grid 2 and the target 3 as represented by the broken line in FIG. 1 to ensure that the patterned electron beam is correctly focussed in the target plane.

Having passed through the grid 2, the elctrons of the beam still under the influence of the magnetic field H continue to travel generally in mutually parallel straight lines substantially at the same velocity at which they enter the grid 2 until they impinge on the resist layer 10 present on the semiconductor wafer 11. The resist coated semiconductor wafer is located at the second magnetic focus in relation the photocathode mask 1. Because of the magnetic field an individual electron will actually follow a helical path about a magnetic field line if it is emitted at an angle other than normally to the photocathode mask 1. Since the distance in the direction parallel to the magnetic field H travelled by the electrons in describing one revolution of a helix under the influence of the magnetic field H is proportional to their velocity, and since the velocity of the electrons between the grid 2 and the target 3 is substantially twice the average of their velocity between the photocathode mask 1 and the grid 2, the spacing of the target 3 from the grid 2 may be substantially twice the spacing of the grid 2 from the photocathode mask 1. With the magnetic and electric field strengths given here, i.e. 2 KG and 20 kV respectively, the spacing may be 7 mm between the photocathode mask 1 and the grid 2, and 14 mm between the grid 2 and the target 3.

By way of explanation it is noted here that the grid 2 can act as an electric lens tending to deflect the electrons passing through it. If unchecked this could cause distortion of the electron image projected onto the target. More precisely, the electric lens effect imparts an additional transverse velocity component to an electron thereby modifying the radius of its helical path. However, with the grid and the target at respective first and second magnetic focii the electron in travelling from the grid to the target will describe a complete revolution of a helix and therefore the net effect is that the electron suffers zero deflection and hence the electron image is projected onto the target 3 substantially without distortion.

In the manufacture of microminiature solid state devices, for example semiconductor devices such as integrated circuits, it is necessary to expose the target several times and on each occasion to a differently patterned electron beam. Between exposures the target is removed from the electron image projector for other processing steps to be carried out.

An alignment facility is therefore necessary, to ensure registration of successive patterns. Alignment generally involves two stages: firstly determining whether and if so to what extent there are any positional errors between the target 3 and the photocathode mask 1, and secondly correcting for any such errors. It is noted here that in practice these two alignment stages may be carried out simultaneously, for example, with a servo-system.

The first stage is carried out using a reference marker pattern on the target which remains on the target throughout the device manufacturing process. Corresponding patterns are provided on each of the photocathode masks used in the process. The location of the reference marker pattern may be ascertained by detecting electrons backscattered therefrom using an electron detector D positioned intermediate the grid 2 and the target 3 outside the region occupied by the projected electrons. In the case when the target is an electron resist coated semiconductor wafer the reference markers on the target may be formed from, for example, silicon dioxide bars or may consist of topographical features, particularly pits, formed at the surface of the semiconductor wafer. The output of the electron detector D may be used in performing the second alignment stage, that is to correct for positional errors by causing the patterned electron beam to be deflected transversely so that it is incident at the correct location on the target.

It is noted here that the first stage of alignment may also involve deflection of the patterned electron beam as discussed in more detail hereinafter.

Figure 1:
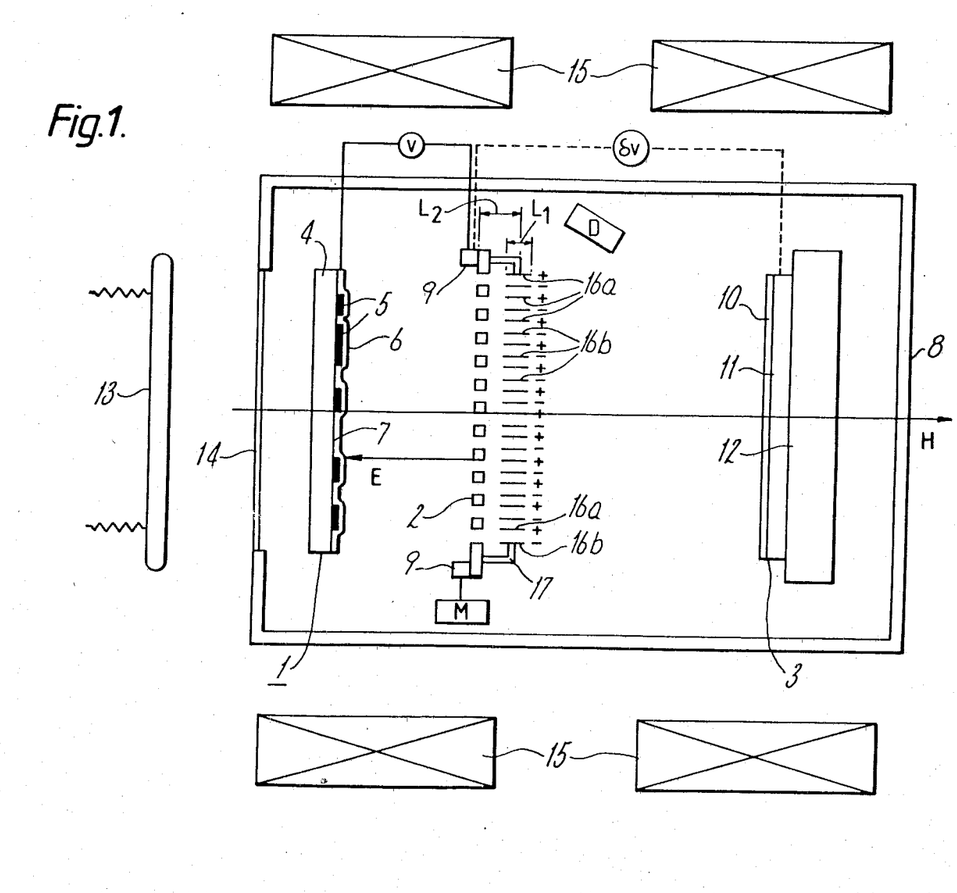
FIG. 1 is a schematic cross-sectional view of an electron image projector in accordance with the invention.
Figure 2A:
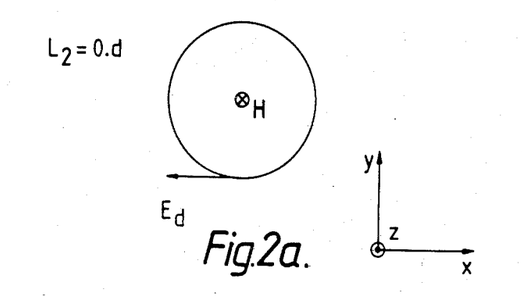
FIGS. 2a, 2b, and 2c are diagrams showing the effect of electrostatic deflection in the image projector of FIG. 1.
Figure 2B:
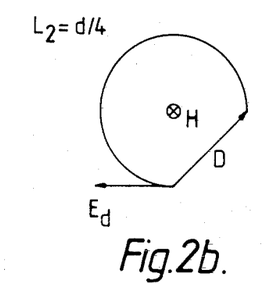
Figure 2C:
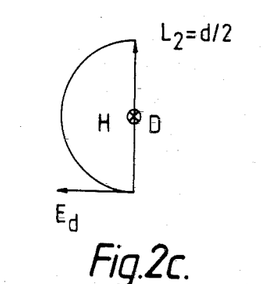

As represented schematically in FIG. 1 electrostatic deflection plates 16a, 16b are provided intermediate the grid 2 and the target 3 for electrostatically deflecting the patterned electron beam during its passage from the grid 2 to the target 3. As shown, a pair of deflection plates is associated with each aperture or electron-permeable portion of the grid for deflecting the beam in a first direction. A further pair of deflection plates may be associated with each aperture and arranged orthogonally to the plates 16a, 16b for deflecting the beam in a direction orothogonal to the first direction. Deflection is achieved by applying an appropriate potential difference between adjacent plates 16a, 16b. The magnitude of the deflection is dependent on the electric field strength across adjacent deflection plates 16a, 16b which in turn is dependent on both the potential difference and the spacing therebetween. When the pitch of the apertures or electron-permeable regions of the grid 2 is, for example 200 micrometers the spacing of adjacent deflection plates 16a, 16b may be, for example 100 micrometers. A suitable electrostatic deflection field strength is of the order of $10^3$ Vcm$^{-1}$ which in this case therefore requires the application of a potential difference of only 10 V across adjacent deflection plates. As the same deflecting field is to be applied to each pair of deflection plates 16a, 16b all corresponding deflection plates 16a can be electrically connected together and, similarly all corresponding deflection plates 16b can be electrically connected together. The same holds true, of course, for orthogonally disposed deflection plates which similarly may have corresponding plates electrically interconnected, although electrically isolated from the plates 16a, 16b so that different electric field strengths can be applied in the two orthogonal directions whereby a full deflection capability is achieved. Both the magnetic and direction of the deflection are dependent on the length $L_1$ of the electrostatic deflection plates and on their separation $L_2$ from the grid 3. This can be explained simply with reference to FIGS. 2a, 2b and 2c which show qualitatively the magnitude and direction of the deflection of an electron beam when the electrostatic deflection plates are provided at different positions intermediate the target 3 and the grid 2. A system of mutually orthogonal coordinate axes is shown in which the z axis extends into the plane of the page. In each case the electron beam is considered to be travelling in the positive z-direction, i.e. into the plane of the page, in a straight line. The direction of the magnetic field H is in the same direction. In each case an electrostatic deflection field $E_d$ is applied in the negative x-direction. FIG. 1a represents the hypothetical situation when the electrostatic deflection plates are provided at $L_2=0.d$ (where d is the spacing between the target 3 and the grid 2) i.e. the deflection plates coincide with the entrance plane of the grid. In this situation the electron beam under the influence of the magnetic field H will describe a complete revolution of a helix before impinging on the target and the net effect will be a zero deflection. In the case where $L_2=\frac{1}{4}d$ (see FIG. 2b) the electron beam after experiencing the electrostatic deflecting force and under the influence of the magnetic field H will describe only three quarters of a revolution of a helix before impinging on the target. The overall deflection is therefore in a direction at 45° to both the positive x- and the y- axes. The magnitude of the deflection is represented by the length of the arrow D. FIG. 2c represents the situation when the electrostatic deflection plates are located at $L_2=\frac{1}{2}d$. In this case the electron beam after experiencing the electrostatic deflecting force $E_d$ and under the influence of the magnetic field H will describe half a revolution of a helix before impinging on the target. The net deflection is in the positive Y- direction and as represented by the length of the arrow D the magnitude of the deflection is a maximum in this case for a given electric field strength $E_d$.

In view of the above explanation it is evident that the direction of deflection is determined not only by the orientation of the electrostatic deflection plates, but also by their position relative to the grid and target. Nevertheless, two pairs of electrostatic deflection plates can always be oriented for deflecting the electron beam in two mutually orthogonal directions giving the maximum deflection capability independent of their position relative to the grid and the target.

Taking one particular example, calculations show that for a deflection sensitivity of approximately 0.14 micrometers/volt, when the spacing of the adjacent deflection plates is 100 micrometers, the deflector length $L_1$ is approximately 100 micrometers and the spacing between the deflection plates and the grid $L_2$ is approximately 3.0 mm. A typical deflection requirement is of the order to 10 micrometers and with a deflection sensitivity of 0.14 micrometers/volt this can be achieved with a voltage difference of 35 volts between adjacent deflection plates.

As mentioned above, the grid is moved in its own plane during electron irradiation. A suitable mounting which permits the grid to move such that it remains accurately parallel to the photocathode mask 1 and a constant distance therefrom is described in more detail in our copending British Patent Application No. 8323769 corresponding to U.S. patent application Ser. No. 645,881 filed Aug. 30, 1984, mentioned above. The movement of the grid may be effected pneumatically, either from outside the vacuum chamber via bellows, or with one or more Bourdon tubes within the chamber. Alternative means for moving the grid are described in the aforementioned British Patent Application No. 8323769.

In the present case the deflection plates 16a, 16b are rigidly connected to the anode grid so that the relative position of the plates and the apertures in the grid remains fixed. In this way the electrons of the beam which pass through the grid are all equally deflected. In FIG. 1 the rigid connection is represented schematically as electrically insulating separating means 17 extending between the deflection plates 16a, 16b and the grid 2. Examples of deflection plates, grid, and separating means having different constructions are described in greater detail below.

Clearly, electrostatic deflection can be used to correct the position of the electron beam with respect to the target at the second stage of alignment as discussed above. Additionally, or alternatively electrostatic deflection may also be employed at the first stage of alignment when any positional errors and their extent are being determined. For this purpose a reference marker pattern is provided on the target, for example a series of 10 bars 100 micrometers long, 5 micrometers wide and spaced apart by 5 micrometer extending in the X- direction and a similar series of 10 bars extending in the Y- direction. The bars may be formed for example of silicon dioxide 1 micrometer thick or tantalum silicide 0.1 micrometers thick or pits approximately 2 micrometers deep at the surface of the semiconductor wafer in the case of semiconductor device manufacture. The photocathode mask 1 is so patterned as to produce an electron beam comprising a patterned portion corresponding to the reference marker pattern on the target. When the patterned electron beam is correctly aligned with respect to the target the patterned portion corresponding to the reference marker pattern is incident on the reference marker pattern on the target. Any misalignment can be determined by detecting electrons backscattered from the reference marker pattern using the electron detector D. It is known to use a modulating technique for determining positional errors wherein the patterned electron beam is deflected in an oscillatory manner in X- and Y- directions, the frequency of oscillation or the phase being different in the two directions. A phase sensitive technique can then be used to differentiate between displacements in the two orthogonal directions and enabling alignment in the two axes to be carried out simultaneously. This modulation technique is described more fully in British Pat. No. 1,467,079 to which reference is invited. In known electron image projectors modulation has been provided magnetically, but in the present projector modulation can be achieved electrostatically and with the dimensions given above by applying to the deflection plates a modulating voltage difference having an oscillating amplitude of approximately 15 volts. The amplitude of the modulation—determined by the magnitude of the voltage difference—may be the same both for the set of deflection plates 16a, 16b and for the set of deflection plates oriented orthogonally thereto, but the frequency or phase of modulation should be different for each set. With electrostatic deflection the patterned electron beam can be modulated at far higher frequencies than is possible using magnetic deflection. Thus for example the modulation frequency in the case of electrostatic deflection may be of the order of kilohertz and the frequency in one axial direction may typically be twice the frequency in the orthogonal axial direction. This enables the positional error information to be obtained more rapidly. Thus in conjunction with the backscattered electron detection technique mentioned previously the whole alignment process can be completed in a very short time interval.

It is noted here that electrostatic deflection need not be used at both stages of alignment. Instead, electrostatic deflection may be provided at the first stage only to provide fast modulation, while magnetic deflection employing conventional deflection coils is used for correcting positional errors at the second stage.

To provide electrostatic modulation only it is not necessary to provide electrostatic deflection plates over the full area of the grid as it is only those parts of the beam corresponding to the reference marker pattern which need to be deflected. As shown schematically in FIG. 3 deflection plates 116a, 116b are provided only at two separate areas A and B respectively on the target side of the anode grid 2. As in FIG. 1 the photocathode mask is referenced 1 and the target 3. The areas A and B correspond to reference marker patterns C and D respectively on the target. The marker pattern A comprises a series of for example 10 parallel bars extending in the Y- direction for obtaining positional information for the direction of the X- axis and the marker pattern B comprises a similar series of bars extending in the X- direction for obtaining positional information for the Y- direction. For the sake of clarity in FIG. 3 the marker patterns are shown as comprising only four such bars. The deflection plates 116a at A are oriented for deflecting part of the electron beam in the X direction over the marker pattern C, and the deflection plates 116b at B are oriented for deflecting part of the electron beam in the Y direction over the marker pattern D. At the remaining areas the electron beam will impinge on the target undeflected. The reference marker patterns C and D are spaced apart so as additionally to provide rotational information in known manner.

Figure 3:
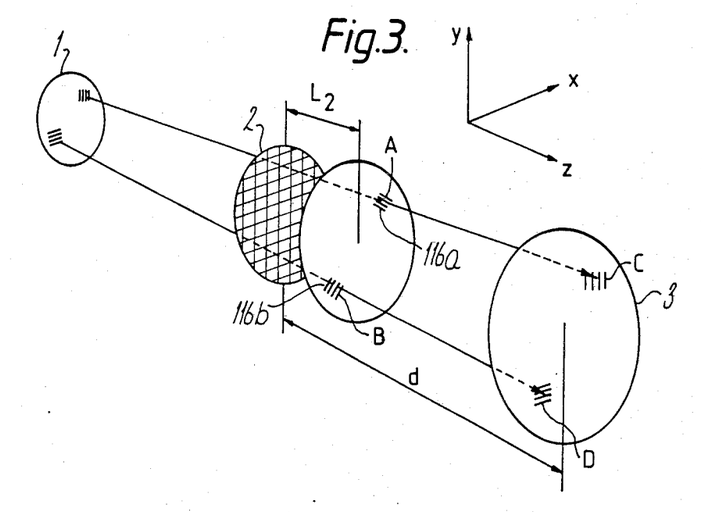
FIG. 3 is a schematic perspective view of some components of an electron image projector.

The orientation of the deflection plates 116a, 116b is determined by their position with respect to the anode grid as explained above. As they are in the same plane the deflection plates 116a will be orthogonal to the deflection plates 116b in order to provide mutually orthogonal deflections. In FIG. 3 the deflection plates 116b are oriented at 45° to both the position X-and the positive Y- axes. The deflection plates 116a are oriented at 45° to the positive X- and the negative Y- axes. With these orientations the deflection plates are located quarter way between the grid 2 and the target 3, nearer the grid than the target. Thus in this case $L_2 = \frac{1}{4}d$.

Figure 4A:
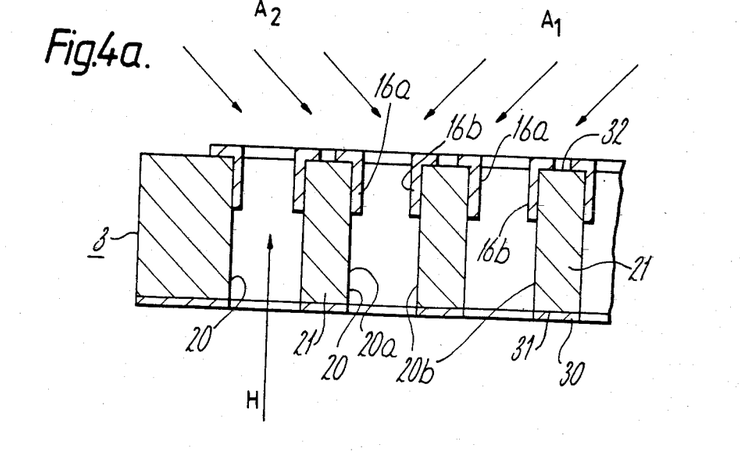
FIG. 4a is a schematic sectional view of part of the anode grid and some of the electrostatic deflection plates in one embodiment of the invention.
Figure 4B:
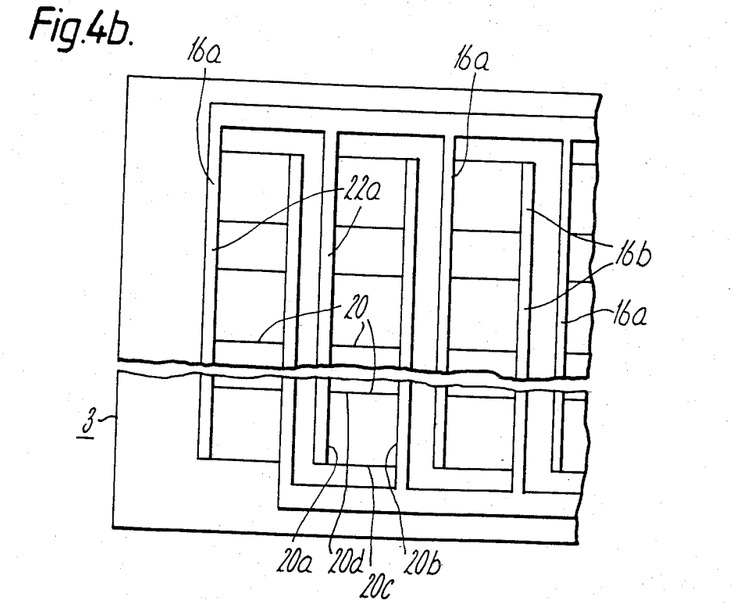
FIG. 4b is a plan view taken from the side of the deflection plates in FIG. 4a, FIG. 5a is a schematic sectional view of part of the anode grid and some of the electrostatic deflection plates in a different embodiment.

Referring now to FIGS. 4a and 4b there will be described an electrostatic deflection arrangement for use in the electron image projector of FIG. 1, in which a deflection plate system is integral with the anode grid for deflecting the electron beam in one direction transversely to the magnetic field H (represented by the arrow in FIG. 4a). FIGS. 4a and 4b show only part of the deflection arrangement. It is noted here that the direction of projection of the electrons is in the same direction as the magnetic field H.

The anode grid 2 is formed from a 2 mm thick sheet of photo-etchable glass, for example Fotoform (registered trademark) glass available from Corning. Apertures 20 are formed in the glass using photolithographic and etching techniques. The apertures 20 may be square in cross section with lateral dimensions of for example 150 micrometers. The spacing of adjacent apertures 20 may be for example, 50 micrometers so that the pitch of the apertures 20 is approximately 200 micrometers. Although shown as having a constant bore in FIG. 4a it is noted that the apertures may be tapered, the narrower end being at the entrance plane of the grid 2.

The anode metallization 30 is provided by evaporating, for example, chromium to a thickness of 2000 angstroms onto the surface 31 of the apertured glass sheet and electrical contact is made at the periphery of the grid via the conductive ring 9 as shown schematically in FIG. 1. The anode metallization 30 constitutes the entrance plane of the grid.

Deflection plates 16a, 16b integral with the grid 2 are formed by evaporating chromium to a thickness of, for example, 2000 angstroms onto two opposite walls 20a, 20b of each of the apertures 20 at the side of the grid remote from the entrance plane. Deposition on the opposite walls 20a, 20b of the apertures 20 is achieved by directional evaporation in the two directions represented by arrows A1 and A2 in FIG. 4a. The shadow effect caused by the remaining portions 21 of the grid 2 between adjacent apertures 20 limits the depth to which the deflection plates extend. The direction of evaporation may be, for example, 45° to the major surface 32 of the apertured glass plate as shown in FIG. 4b so that the deflection plates 16a, 16b extend from the surface 32 approximately 150 micrometers into the apertures 20. Within the apertures 20 deposition of the chromium can be restricted to the two walls 20a, 20b if the direction of evaporation is arranged such that it is parallel to the other two walls 20c, 20d and/or if the two walls 20c, 20d on which deposition is not desired are cut-back from the surface 32, e.g. by etching, before evaporation. During the directional depositions chromium is deposited as a layer over the whole surface 32 of the apertured glass plate. This chromium layer is patterned using conventional photolithography and etching so as to electrically isolate the deflection plates 16a from the plates 16b and to form chromium interconnects 22a and 22b (as shown in FIG. 4b) which electrically connect together all the deflection plates 16a and 16b respectively. The deflection plates 16a, 16b may extend approximately 15 micrometers onto surface 32 so that adjacent plates 16a, 16b are spaced apart by 20 micrometers and the width of the interconnects 22a, 22b may be 15 micrometers. By applying a potential difference between the interconnects 22a and 22b an electric field of equal strength and in the same sense is established between each pair of deflection plates 16a, 16b.

In this embodiment each aperture in the grid may have associated therewith a pair of electrostatic deflection plates 16a, 16b for deflecting the electron beam transversely to the magnetic field H. In view of the previous discussion, however, it will be evident that the deflection plates 16a, 16b need not be provided at each of the apertures 20 in the grid 2. Particularly in the case where the electron beam is to be modulated for alignment purposes deflection plates may be provided only at certain areas of the grid. Thus one area corresponding to a reference marker pattern on the target may be provided for deflecting the similarly patterned part of the electron beam in a first direction and another area corresponding to a further reference marker pattern on the target may be provided for simultaneously deflecting the similarly patterned part of the electron beam in a direction orthogonal to the first direction. The orientation of the deflection plates will depend on their spacing from the grid as explained above, but deflection plates at one area will be orthogonal to those at the other area. It will be evident in light of the above description that this configuration can be achieved by appropriate directional evaporation and lithographic patterning of the deflector plate material at the area in question while masking the areas where metallization is not required.

Figures 5A, 5B, 5C:
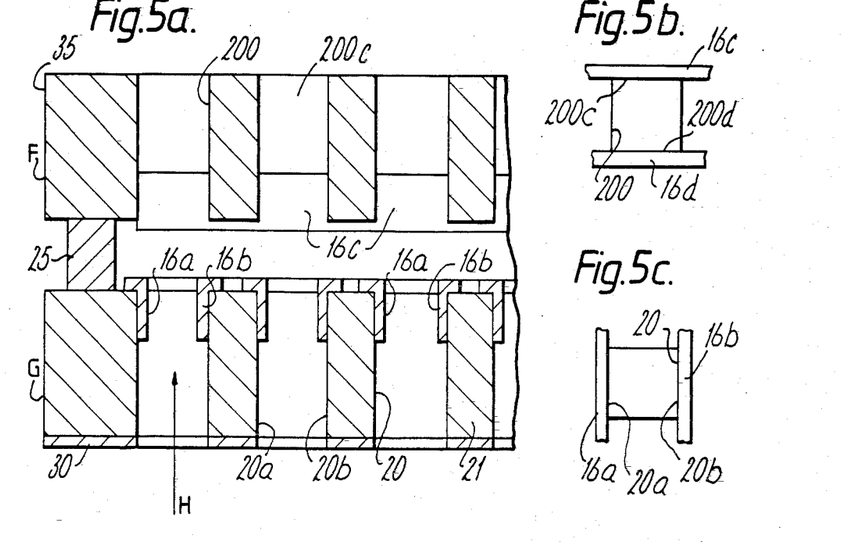

Referring now to FIGS. 5a to 5c there will be described an electrostatic deflection arrangement for use in the image projector in FIG. 1 for deflecting the beam in two mutually orthogonal directions transversely to the magnetic field (represented by the arrow H in FIG. 5a). It is noted here that the direction of projection of the electrons is in the same direction as the magnetic field H.

This deflection arrangement comprises an anode grid G which in all respects is equivalent to the grid described above with reference to FIGS. 4a and 4b and therefore similarly has integral deflection plates 16a, 16b for deflecting the electron beam in one direction. FIG. 5b is a plan view of a single aperture in the grid G from the side on which the deflection plates 16a, 16b are present. As before the deflection plates 16a, 16b are on two opposite walls 20a, 20b of the apertures 20.

A further grid F is provided on the side of the grid G remote from the anode metallization 30. A annular spacing member 25 made of an insulating material, for example PTFE rigidly connects the two grids and maintains them in spaced relation. The spacing between grid F and anode grid G may be for example 3 mm.

Grid F may comprise an apertured plate 30 of photo-etchable glass with the same dimensions as that of anode grid G. Deflection plates 16c, 16d are provided on opposite walls 200c, 200d of apertures 200 in plate 30 using directional evaporation followed by photolithography as for the deflection plates 16a, 16b of the anode grid G. FIG. 5c is a plan view of a single aperture in grid F from the side on which the deflection plates 16b, 16c are present. The deflection plates 16b, 16c are oriented with respect to deflection plates 16a, 16b formed on the anode grid so as to provide deflection of the electron beam substantially in two mutually orthogonal directions. In view of the previous discussion, it will be evident that the relative orientation of the deflection plates is determined by the spacing of the grids F and G. This spacing can be altered simply by using a spacing member 25 having a different thickness.

It is noted here, however, that grid F may alternatively be assembled such that the deflection plates 16c, 16d are at the surface of the apertured glass plate 30 remote from grid G in which case the spacing between the deflection plates 16a, 16b and 16c, 16d is also dependent on the thickness of the glass plate 30. If desired, the spacing member 25 can then be omitted altogether as the glass plate 30 will electrically insulate the deflection plates 16a, 16b from the deflection plates 16c, 16d.

In both cases the grid F can be made in a manner analogous to that for making grid G, except that the anode metallization is not required.

Figures 6A, 6B, 6C:
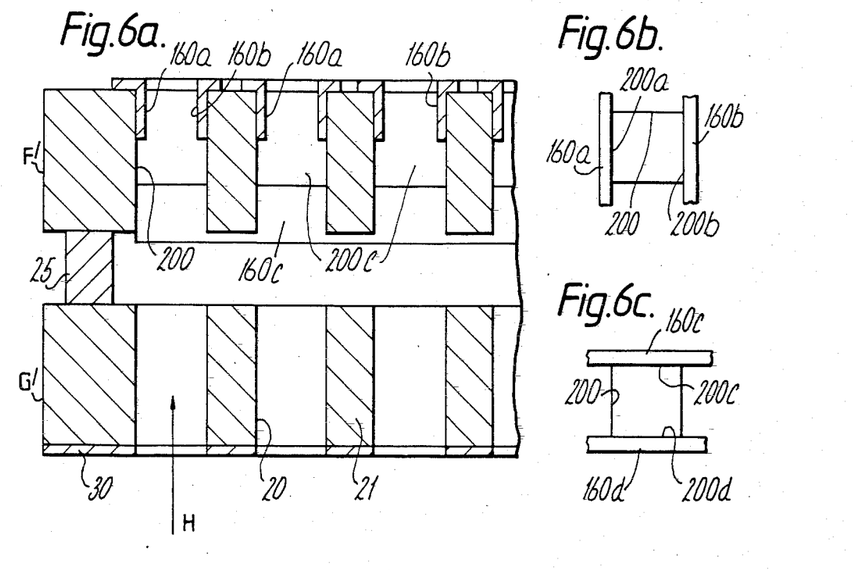

FIGS. 6a and 6c illustrate a modified deflection arrangement for use in the electron image projector of FIG. 1 again for deflecting the electron beam in two mutually orthogonal directions. In this case the anode grid G' may be similar to the anode grid G described with reference to FIG. 5a above except that no deflection plates are present thereon. Instead, two sets of mutually orthogonal deflection plates 160a, 160b and 160c, 160d are provided respectively at opposite major surfaces of the further grid F'. Deflection plates 160a and 160b are provided, again by directional evaporation and lithography, on opposite walls 200a and 200b respectively of the apertures 200 in grid F' at the major surface remote from the anode grid G'. FIG. 6b is a plan view of a single aperture 200 and associated deflection plates taken from the side of grid F' remote from the anode grid G'. Deflection plates 160c and 106d are provided using similar directional evaporation and lithography on opposite walls 200c and 200d respectively of the apertures 200 in grid F' at the major surface facing the anode grid G'. The directions of evaporation for providing the deflection plates 160c, 160d are orthogonal to the directions of evaporation for providing the deflection plates 160a, 160b. FIG. 6c is a plan view of a single aperture 200 and associated deflection plates taken from the side of the grid F' facing the anode grid G'. As both sets of deflection plates 160a, 106b and 160c, 160d are formed as part of the same grid F' and are electrically insulated from the anode grid G' the latter may be formed by a conducting material such as, for example, an apertured sheet of copper.

While the apertures 200 shown in FIGS. 6a to 6c have a square cross-section, it may be preferable that they are not precisely square but instead that they have a rhomboidal cross-section so that the deflection plates provided on opposite walls of the apertures are mutually parallel, but not orthogonal to the deflection plates on adjacent walls. In this way compensation can be made for the longitudinal spacing of the different sets of deflection plates 160a, 106b and 106c, 106d so that the electron beam can be deflected in two mutually orthogonal directions. The precise angles between adjacent walls of the rhomboidal apertures will depend on the thickness of the plate from which the grid F' is made. If this plate comprises (110) silicon instead of photo-etchable glass anisotropic etching can be used with, for example, a mixture of ethylenediamine, pyrocatechol, and water as the etchant to form apertures through the full thickness of the silicon plate which have perpendicular walls and a rhomboidal cross-section. Anisotropic etching of silicon is itself a well-known technique and for more information about the particular etchant mentioned here reference is invited to the paper by Bean in IEEE Trans. Elec. Devices, Vol. ED-25, 10, pp. 1185-93, 1978. As mentioned above the thickness of the silicon can be tailored to provide two mutually orthogonal deflection directions depending on the relative inclination of adjacent walls of the apertures.

I claim:

1. An electron image projector for projecting a beam of electrons with substantially unity magnification comprising
    an electron emissive photocathode for emitting a beam of electrons under a substantially uniform electric field in a predetermined spacial pattern extending transversely to said electric field,
    an anode including an anode grid structure having an array of electron permeable regions, said array being at least as extensive as said spacial pattern, said anode grid structure being disposed parallel to said photocathode, wherein said electric field in operation is produced between said photocathode and said anode grid structure,
    a target receiving said beam of electrons, wherein said anode grid structure is disposed intermediate to said photocathode and said target,
    first means for producing a substantially uniform magnetic field parallel to said electric field to focus a patterned beam of electrons onto said target, and
    second means for deflecting electrons of said beam transversely to both said electric field and said magnetic field, said second means including electrostatic deflection plates arranged for deflecting at least a part of said beam of electrons during passage from a surface of said anode grid structure facing said photocathode to said target.

2. An electron image projector according to claim 1, wherein said surface of said anode grid structure is disposed substantially in coincidence with a focus of said magnetic field.

3. An electron image projector according the claim 1 or claim 1, wherein said electrostatic deflection plates deflect electrons of said beam of electrons in two mutually and substantially orthogonal directions.

4. An electron image projector according to claim 3, wherein said electron permeable regions of said anode grid structure include a plurality of areas with each of said areas having a respective set of said electrostatic deflection plates.

5. An electron image projector according to claim 4, wherein said anode grid structure includes an array of electron impermeable regions with said array of electron permeable regions, and wherein each of said electron permeable regions has said respective set of electrostatic deflection plates.

6. An electron image projector according to claim 5, wherein means are provided for moving said anode grid structure transversely to the direction of motion of said electrons, and wherein said electrostatic deflection plates are rigidly fixed with respect to said electron permeable array of said anode grid structure.

7. An electron image projector according to claim 6, wherein a further grid is provided, said further grid structure being rigidly connected to said anode grid structure at a side opposite to said photocathode.

8. An electron image projector according to claim 7, wherein said anode grid structure includes a first aperatured insulating member, and wherein said electrostatic deflection plates are provided on walls of apertures in said first insulating member.

9. An electron image projector according to claim 8, wherein said further grid structure includes a second apertured insulating member, and wherein said electrostatic deflection plates are provided on walls of said apertures in said first insulating member, and deflection plates for deflecting said beams of electrons in a direction orthogonal to said deflection plates on said first insulating member are present on walls of apertures in said second insulating member of said further grid structure.

10. An electron image projector according to claim 7, wherein said further grid structure includes an apertured insulating member, and wherein said electrostatic deflection plates are present on walls of apertures in said insulating member of said further grid structure at one major surface of said further grid structure, and said electrostatic deflection plates are further present on walls of said apertures in said insulating member of said further grid structure at an opposite major surface, said deflection plates at opposite major surfaces being mutually orthogonal.

11. An electron image projector according to claim 8, wherein said anode grid structure with said array of electron permeable regions has at least one area having associated ones of said electrostatic deflection plates oriented for deflecting part of said beam of electrons in a first direction, and at least one other area having associated ones of said electrostatic deflection plates oriented for simultaneously deflecting another part of said beam of electrodes in a second different direction.

12. An electron image projector according to claim 1 or claim 2, wherein said electron permeable regions of said anode grid structure include a plurality of areas with each of said areas having a respective set of said electrostatic deflection plates.

13. An electron image projector according to claim 1 or claim 2, wherein said anode grid structure includes an array of electron impermeable regions with said array of electron permeable regions, and wherein each of said electron permeable regions has said respective set of electrostatic deflection plates.

14. An electron image projector according to claim 1 or claim 2, wherein means are provided for moving said anode grid structure transversely to the direction of motion of said electrons, and wherein said electrostatic deflection plates are rigidly fixed with respect to said electron permeable array of said anode grid structure.

15. An electron image projector according to claim 1 or claim 2, wherein a further grid structure is provided, said further grid structure being rigidly connected to said anode grid structure at a side opposite to said photocathode.

16. An electron image projector according to claim 15, wherein said anode grid structure includes a first aperatured insulating member, and wherein said electrostatic deflection plates are provided on walls of apertures in said first insulating member.

17. An electron image projector according to claim 16, wherein said further grid structure includes a second apertured insulating member, and wherein said electrostatic deflection plates are provided on walls of said apertures in said first insulating member, and deflection plates for deflecting said beams of electrons in a direction orthogonal to said deflection plates on said first insulating member are present on walls of apertures in said second insulating member of said further grid structure.

18. An electron image projector according to claim 15, wherein said further grid structure includes an apertured insulating member, and wherein said electrostatic deflection plates are present on walls of apertures in said insulating member of said further grid structure at one major surface of said further grid structure, and said electrostatic deflection plates are further present on walls of said apertures in said insulating member of said further grid structure at an opposite major surface, said deflection plates at opposite major surfaces being mutually orthogonal.

19. An electron image projector according to claim 1 or claim 2, wherein said anode grid structure includes a first aperatured insulating member, and wherein said electrostatic deflection plates are provided on walls of apertures in said first insulating member.

20. An electron image projector according to claim 1 or claim 2, wherein said anode grid structure with said array of electron permeable regions has at least one area having associated ones of said electrostatic deflection plates oriented for deflecting part of said beam of electrons in a first direction, and at least one other area having associated ones of said electrostatic deflection plates oriented for simultaneously deflecting another part of said beam of electrodes in a second different direction.

* * * * *